US012765412B2

(12) United States Patent
Ishido et al.

(10) Patent No.: US 12,765,412 B2
(45) Date of Patent: Oct. 13, 2026

(54) MODULE

(71) Applicant: Murata Manufacturing Co., Ltd., Kyoto-fu (JP)

(72) Inventors: Mitsuo Ishido, Nagaokakyo (JP); Minoru Komiyama, Nagaokakyo (JP); Ryota Sato, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 362 days.

(21) Appl. No.: 18/426,645

(22) Filed: Jan. 30, 2024

(65) Prior Publication Data

US 2024/0170356 A1 May 23, 2024

Related U.S. Application Data

(63) Continuation of application No. PCT/JP2022/026978, filed on Jul. 7, 2022.

(30) Foreign Application Priority Data

Aug. 10, 2021 (JP) ................................ 2021-130899

(51) Int. Cl.
*H10W 74/10* (2026.01)
*H10W 90/00* (2026.01)

(52) U.S. Cl.
CPC .......... *H10W 74/114* (2026.01); *H10W 90/00* (2026.01)

(58) Field of Classification Search
CPC ... H10W 74/114; H10W 90/00; H10W 42/20; H10W 42/121; H10W 74/01; H10W 74/127
See application file for complete search history.

(56) References Cited

U.S. PATENT DOCUMENTS 6,400,014 B1 * 6/2002 Huang ................ H10W 40/778 257/E23.092
10,804,217 B2 10/2020 Cho et al.
2017/0294387 A1 * 10/2017 Kawabata ............. H10W 42/20
2019/0269046 A1 * 8/2019 Takizawa ............... H05K 1/181
(Continued)

FOREIGN PATENT DOCUMENTS

JP 2019-149466 A 9/2019
KR 20170020663 A * 2/2017 ............ H10W 90/00
(Continued)

OTHER PUBLICATIONS

International Search Report for PCT/JP2022/026978 dated Sep. 20, 2022.

*Primary Examiner* — Mark W Tornow
(74) *Attorney, Agent, or Firm* — McDonald Hopkins LLC

(57) ABSTRACT

A module includes: a substrate having a first surface; a first component mounted on the first surface; a first sealing resin that seals at least a part of the first surface and at least a side surface of the first component; and a shield film that is grounded and covers a surface of the first sealing resin on a side farther from the substrate. A surface of the first component on a side farther from the substrate is exposed from the first sealing resin. When the surface of the first component that is exposed from the first sealing resin is defined as a first exposed surface, the first exposed surface has a region covered with the shield film, the region including a strip-shaped portion that is locally reduced in surface roughness.

13 Claims, 11 Drawing Sheets

(56) References Cited

U.S. PATENT DOCUMENTS

| | | | | |
|---|---|---|---|---|
| 2020/0051926 | A1 | 2/2020 | Cho et al. | |
| 2022/0189838 | A1* | 6/2022 | Okabe ...................... | H05K 9/00 |
| 2022/0264748 | A1 | 8/2022 | Okabe et al. | |

FOREIGN PATENT DOCUMENTS

| | | | |
|---|---|---|---|
| WO | 2021/049400 | A1 | 3/2021 |
| WO | 2021/124806 | A1 | 6/2021 |

* cited by examiner

MODULE

CROSS REFERENCE TO RELATED APPLICATION

This is a continuation of International Application No. PCT/JP2022/026978 filed on Jul. 7, 2022 which claims priority from Japanese Patent Application No. 2021-130899 filed on Aug. 10, 2021. The contents of these applications are incorporated herein by reference in their entireties.

BACKGROUND OF THE DISCLOSURE

Field of the Disclosure

The present disclosure relates to a module.

Description of the Related Art

U.S. Pat. No. 10,804,217B2 (PTL 1) discloses a configuration in which a chip-shaped semiconductor die is mounted on a surface of a substrate, which is sealed with a resin whose upper surface and side surface are covered with a shield layer. The upper surface of the semiconductor die is exposed from a sealing resin and is in contact with a shield film.

PTL 1: U.S. Pat. No. 10,804,217B2

BRIEF SUMMARY OF THE DISCLOSURE

In order to reliably expose the upper surface of the chip-shaped component such as a semiconductor die from the sealing resin before forming a shield film, it may be conceivable to employ a method of forming a sealing resin once so as to completely cover the chip-shaped component, and then grinding its upper surface. By grinding the upper surface to a depth at which a part of the chip-shaped component is also removed, it is possible to obtain a configuration in which the upper surface of the chip-shaped component and the upper surface of the sealing resin are exposed on the same plane.

However, this grinding process causes a large number of grinding scratches on the upper surface of the chip-shaped component. Such a large number of grinding scratches may include scratches that are large in size of a certain level or more. In the following description, a "grinding scratch" means a scratch that is large in size of a certain level or more.

If a shield film is formed by a film forming method such as sputtering so as to cover the upper surfaces of the sealing resin and the chip-shaped component in the state in which grinding scratches exist, the shield film may not be normally formed. For example, when the shield film is to shrink due to a temperature change, peeling off of the shield film may start from such a grinding scratch. As the grinding scratch is longer, the shield film is more likely to peel off. This is because the stress causing peeling off of the shield film increases in proportion to the length of the grinding scratch. When the shield film peels off, the shielding property of the module deteriorates.

Thus, a possible benefit of the present disclosure is to provide a module in which peeling off of a shield film caused by a grinding scratch formed on a top surface of a component can be made less likely to occur.

In order to achieve the above-described possible benefit, a module according to the present disclosure includes: a substrate having a first surface; a first component mounted on the first surface; a first sealing resin that seals at least a part of the first surface and at least a side surface of the first component; and a shield film that covers a surface of the first sealing resin on a side farther from the substrate, the shield film being grounded. A surface of the first component on a side farther from the substrate is exposed from the first sealing resin. When the surface of the first component that is exposed from the first sealing resin is defined as a first exposed surface, the first exposed surface has a region covered with the shield film, the region including a strip-shaped portion that is locally reduced in surface roughness.

According to the present disclosure, even if the first exposed surface of the first component has a grinding scratch, this grinding scratch is divided into short pieces by the strip-shaped portion, and the stress causing peeling off of the shield film is also divided and reduced, with the result that peeling off of the shield film caused by the grinding scratch formed on the top surface of the component can be made less likely to occur.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept "upper" or "lower" does not necessarily indicate an absolute upper or lower position, but may indicate a relatively upper or lower position in the posture shown in each figure.

First Embodiment

Figure 1:
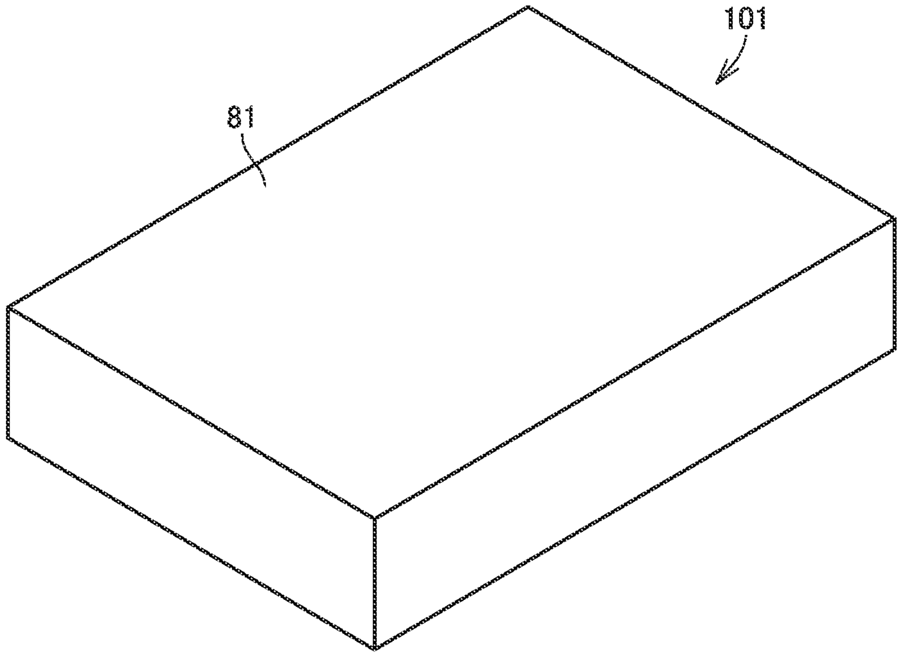
FIG. 1 is a first perspective view of a module in a first embodiment according to the present disclosure.
Figure 2:
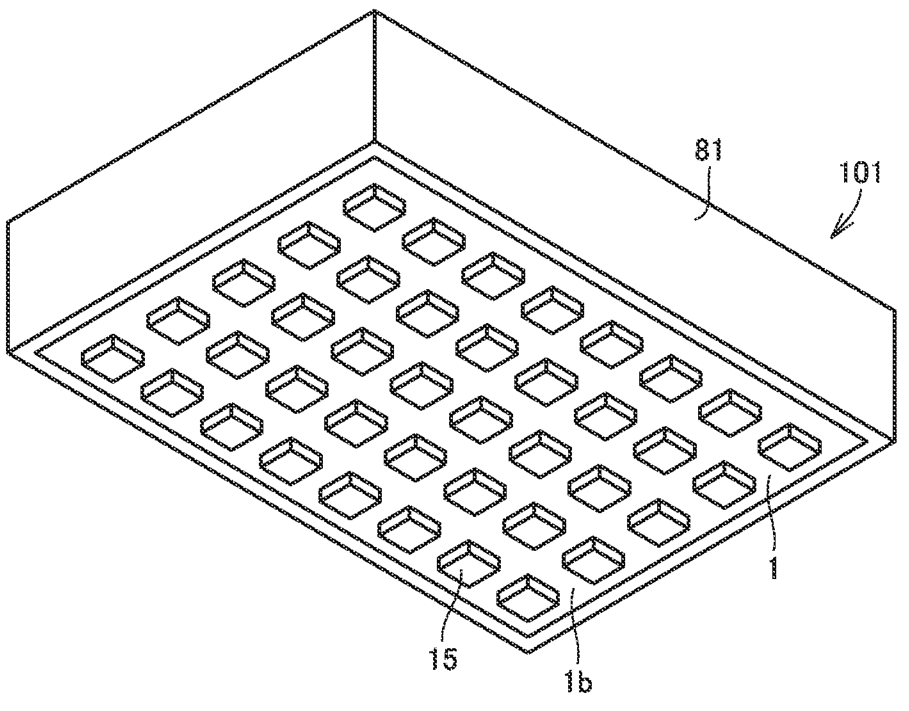
FIG. 2 is a second perspective view of the module in the first embodiment according to the present disclosure.
Figure 3:
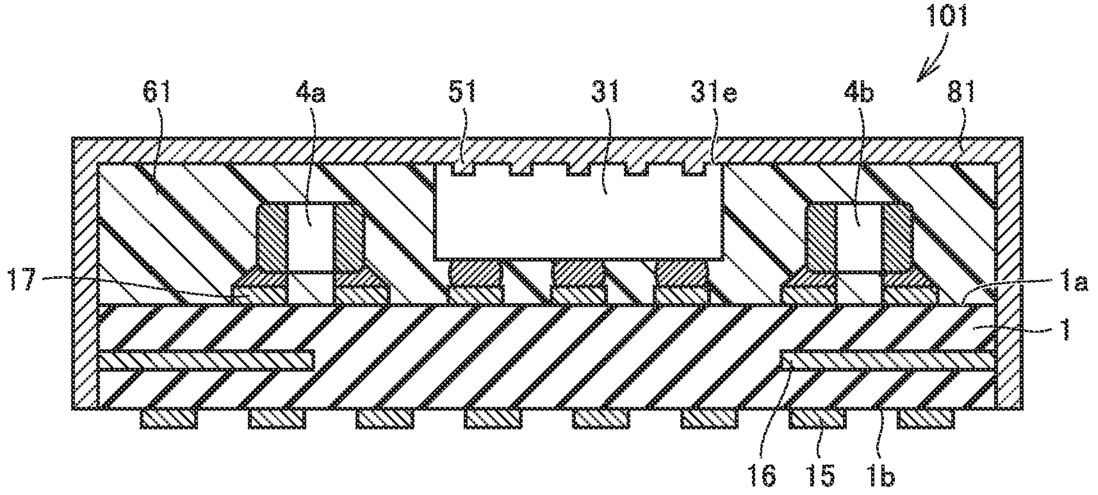
FIG. 3 is a cross-sectional view of the module in the first embodiment according to the present disclosure.

Referring to FIGS. 1 to 6, a module in the first embodiment according to the present disclosure will be described. FIG. 1 shows a perspective view of a module 101 in the present embodiment. FIG. 2 shows module 101 viewed obliquely from below. FIG. 3 shows a cross-sectional view of module 101.

Module 101 in the present embodiment includes: a substrate 1 having a first surface 1*a*; a first component 31 mounted on first surface 1*a*; a first sealing resin 61 that seals at least a part of first surface 1*a* and at least a side surface of first component 31; and a shield film 81 that is grounded and covers a surface of first sealing resin 61 on a side farther from substrate 1. A surface of first component 31 on a side farther from substrate 1 is exposed from first sealing resin 61. When the surface of first component 31 that is exposed from first sealing resin 61 is defined as a first exposed surface 31*e*, first exposed surface 31*e* has a region covered with shield film 81 and including a strip-shaped portion 51 that is locally reduced in surface roughness. In FIG. 3, strip-shaped portion 51 is shown as being recessed as compared with other regions, for convenience of explanation. In practice, strip-shaped portion 51 may be recessed as compared with other regions, may be equal in height to other regions, or may be higher than other regions. Strip-shaped portion 51 is, for example, a mark produced by irradiation with a laser beam.

Figure 4:
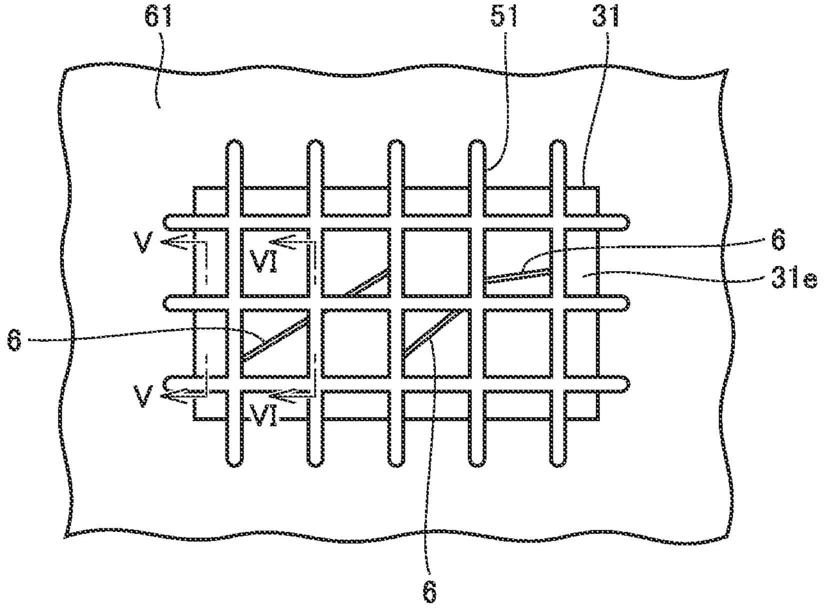
FIG. 4 is a partially enlarged plan view of the module in the first embodiment according to the present disclosure, from which a shield film is removed.

FIG. 4 shows first component 31 and the vicinity thereof in module 101 shown in FIG. 3, from which shield film 81 has been removed. In the present example, strip-shaped portion 51 is formed in a lattice shape. Strip-shaped portion 51 is formed not only to remain inside first exposed surface 31*e* of first component 31 but also to protrude around first exposed surface 31*e*. First exposed surface 31*e* may have a grinding scratch 6. As illustrated in FIG. 4, even if grinding scratch 6 exists, this grinding scratch 6 is overwritten with strip-shaped portion 51 formed by laser processing.

Figure 5:
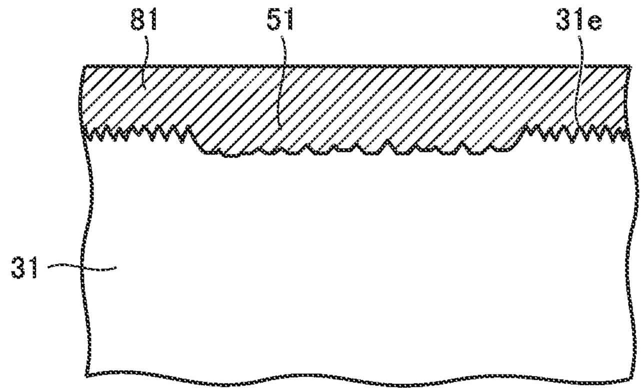
FIG. 5 is a cross-sectional view taken along an arrow line V-V in FIG. 4.

FIG. 5 shows a cross-sectional view taken along an arrow line V-V in FIG. 4. FIG. 5 shows a cross section in the state in which shield film 81 also exists. As shown in FIG. 5, first exposed surface 31*e* has fine irregularities, and these fine irregularities are gentler in strip-shaped portion 51 than in other portions. It can also be said that strip-shaped portion 51 is less in surface roughness than other portions. In the example shown in FIG. 5, strip-shaped portion 51 is lower in height than other regions, which is however merely by way of example. As described above, strip-shaped portion 51 may be higher than other regions or may be equal in height to other regions.

Figure 6:
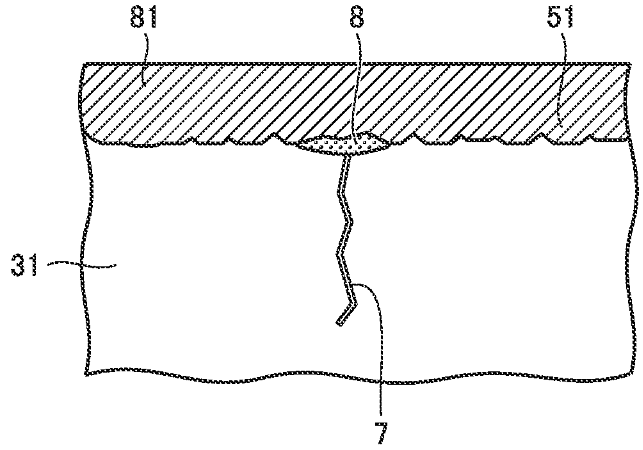
FIG. 6 is a cross-sectional view taken along an arrow line VI-VI in FIG. 4.

FIG. 6 shows a cross-sectional view taken along an arrow line VI-VI in FIG. 4. FIG. 6 shows a cross section in the state in which shield film 81 also exists. Although there was originally a large recessed portion in the area where grinding scratch 6 existed, the material of first component 31 was melted once by laser processing and then resolidified to thereby form a resolidified portion 8, with the result that this resolidified portion 8 has substantially filled the large recessed portion. Since this portion of first component 31 is not the surface on which a circuit is disposed but the surface of the material in a bulk state, no problem occurs in the performance of first component 31 even if first component 31 is melted to a certain level of depth. A crack 7 may be produced below the recessed portion of grinding scratch 6 due to an impact during grinding. However, when the material in the vicinity of the surface is once melted, this material is remained and resolidified so as to close this crack 7, and thus, further development of crack 7 is less likely to occur.

In the present embodiment, since grinding scratch 6 is overwritten with strip-shaped portion 51 to thereby improve the surface state, grinding scratch 6 is divided into short pieces by strip-shaped portion 51. As a result, peeling off of shield film 81 caused by grinding scratch 6 formed on the top surface of the component can be made less likely to occur. Alternatively, even when grinding scratch 6 itself is deeply formed in place of crack 7, grinding scratch 6 can be substantially filled with resolidified portion 8 as in the above description, and therefore, peeling off of shield film 81 caused by grinding scratch 6 can be made less likely to occur.

As described in the present embodiment, strip-shaped portion 51 is preferably arranged in a lattice shape. This is because employing this configuration allows strip-shaped portion 51 to efficiently divide grinding scratch 6.

As described in the present embodiment, strip-shaped portion 51 preferably includes resolidified portion 8 made of the material of first component 31. This is because employing this configuration allows resolidified portion 8 to close grinding scratch 6 that has been once produced.

Figure 7:
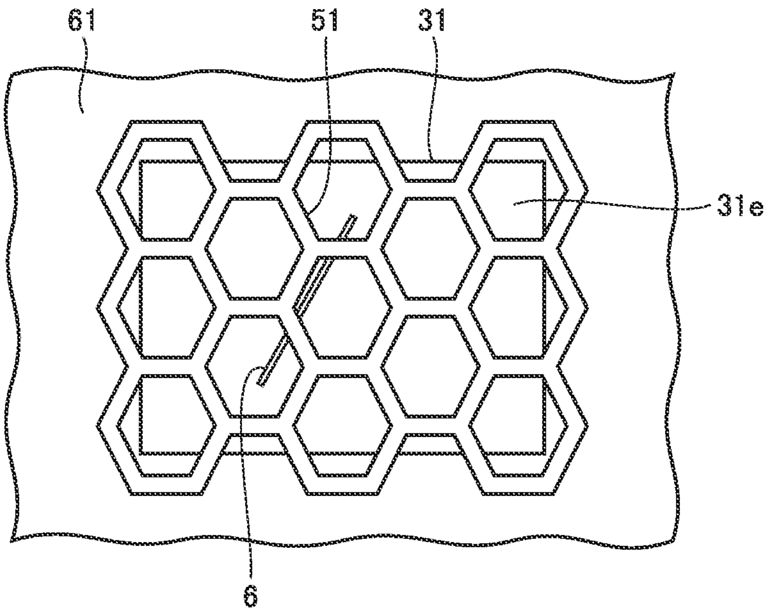
FIG. 7 is a partially enlarged plan view of a first modification of the module in the first embodiment according to the present disclosure, from which a shield film is removed.
Figure 8:
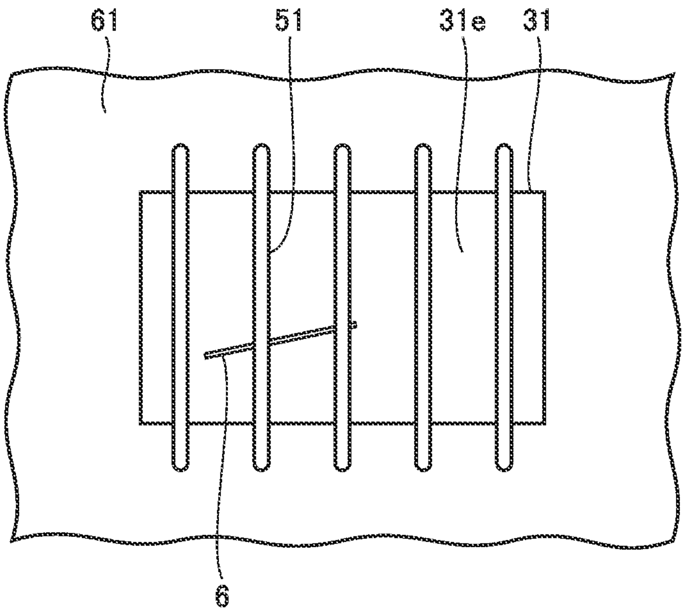
FIG. 8 is a partially enlarged plan view of a second modification of the module in the first embodiment according to the present disclosure, from which a shield film is removed.

In the above-described example, strip-shaped portion 51 is arranged in a lattice shape, but the layout of strip-shaped portion 51 is not limited thereto. For example, as shown in FIG. 7, strip-shaped portion 51 may be arranged in a pattern in which hexagons are combined. In short, strip-shaped portion 51 should only be arranged such that, even when grinding scratches 6 exist in random directions at random positions, grinding scratches 6 can be partitioned by strip-shaped portion 51 so as to be divided into pieces each having a certain length or less without missing any of grinding scratches 6 as much as possible. When the direction in which grinding scratch 6 exists can be predicted to some extent, strip-shaped portions 51 may be arranged in a pattern as shown in FIG. 8. In the example shown in FIG. 8, strip-shaped portions 51 are arranged in a stripe pattern. If grinding scratch 6 is parallel to the stripe pattern of strip-shaped portion 51, grinding scratch 6 may be remained without being divided by any of strip-shaped portions 51, but if the direction of grinding scratch 6 can be predicted and the direction of the stripes can be set so as to reliably intersect somewhere along grinding scratch 6, the pattern as shown in FIG. 8 is also effective.

Referring to FIGS. 9 to 14, a manufacturing method for obtaining module 101 in the present embodiment will be described. In order to obtain module 101, in practice, it may be conceivable to employ a method of performing a manufacturing process using an aggregate substrate equivalent in size to a plurality of substrates 1 and thereafter dividing the aggregate substrate into pieces each equivalent in size to individual module 101, but the explanation will be given in this case by illustration in size of individual substrate 1.

Figure 9:
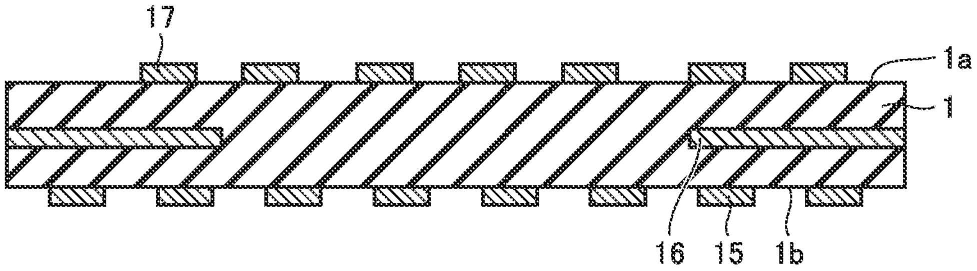
FIG. 9 is an explanatory diagram of a first step of a method of manufacturing the module in the first embodiment according to the present disclosure.

First, substrate 1 is prepared as shown in FIG. 9. Substrate 1 has a first surface 1*a* and a second surface 1*b* opposite to first surface 1*a*. A plurality of electrodes 17 are disposed on first surface 1*a*. A plurality of external terminals 15 are disposed on second surface 1*b*. Inside substrate 1, for example, a GND conductor pattern 16 is disposed. Substrate 1 may be a multilayer body obtained by stacking a plurality of insulating layers. Substrate 1 may have a configuration in which insulating layers and conductive layers formed in a certain pattern are alternately stacked. Further, substrate 1 may include a conductor pattern other than GND conductor pattern 16. Substrate 1 may include a conductive via penetrating the insulating layer so as to electrically connect the conductive layers sandwiching the insulating layer. The material of the insulating layer included in substrate 1 may be a resin or ceramic.

Figure 10:
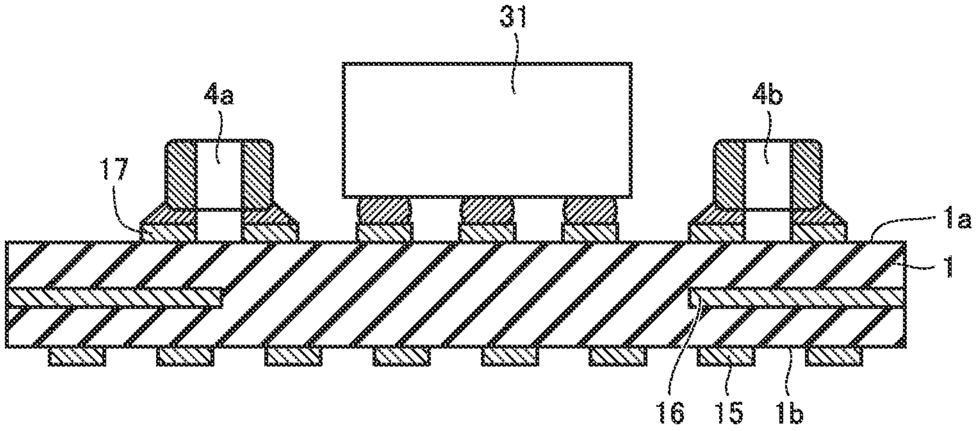
FIG. 10 is an explanatory diagram of a second step of the method of manufacturing the module in the first embodiment according to the present disclosure.

As shown in FIG. 10, components 4*a* and 4*b* and first component 31 are mounted on first surface 1*a*. These components are mounted with a plurality of electrodes 17 interposed therebetween. These components are connected, for example, by soldering.

Figure 11:
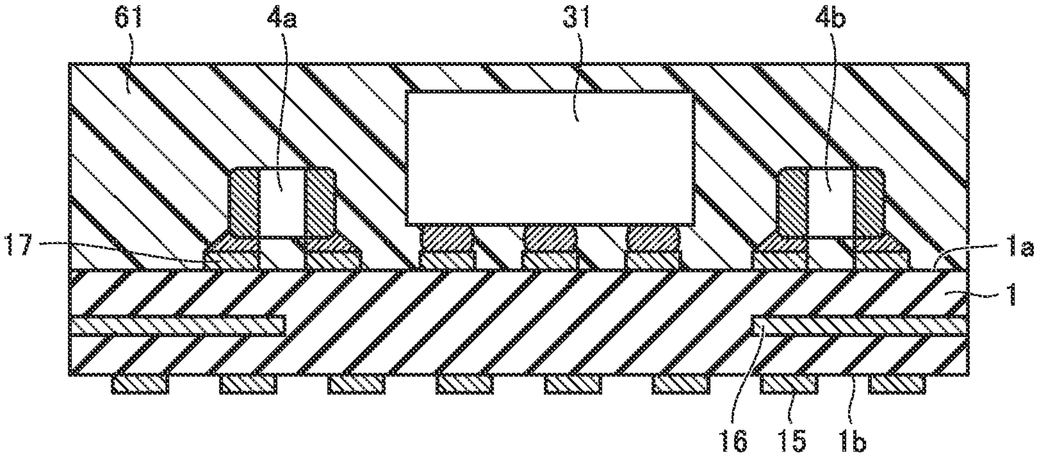
FIG. 11 is an explanatory diagram of a third step of the method of manufacturing the module in the first embodiment according to the present disclosure.

As shown in FIG. 11, first sealing resin 61 is formed. First surface 1*a* is covered with first sealing resin 61. Components 4*a* and 4*b* and first component 31 on first surface 1*a* are covered with first sealing resin 61. The highest component among components 4*a*, 4*b*, and first component 31 is first component 31, and the upper surface of this first component 31 is also covered with first sealing resin 61.

Figure 12:
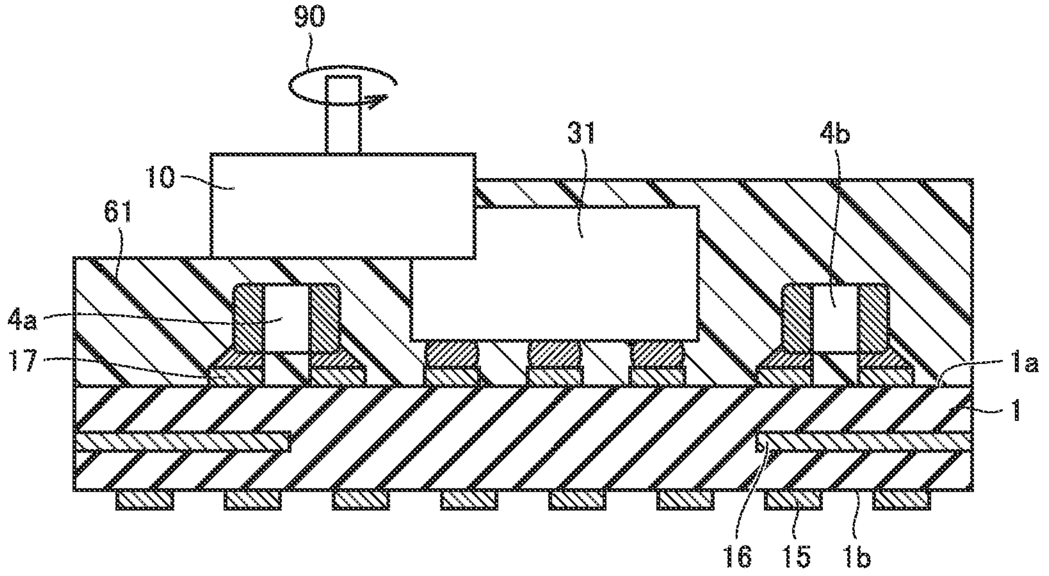
FIG. 12 is an explanatory diagram of a fourth step of the method of manufacturing the module in the first embodiment according to the present disclosure.
Figure 13:
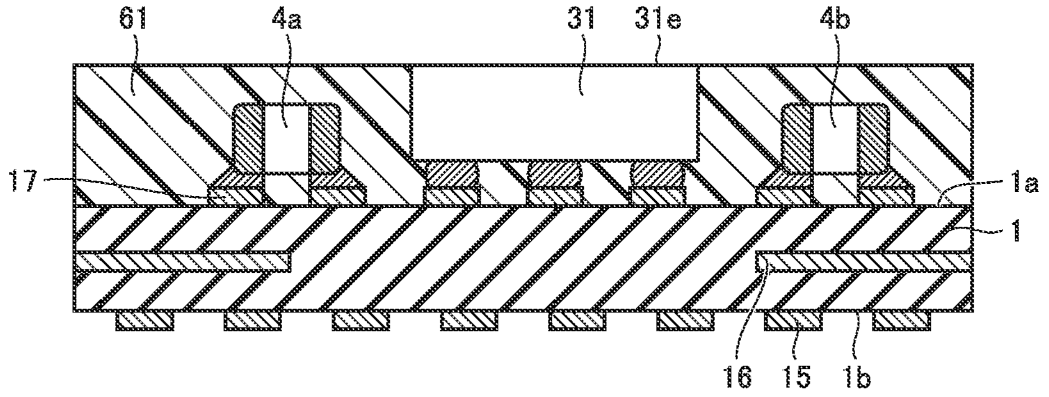
FIG. 13 is an explanatory diagram of a fifth step of the method of manufacturing the module in the first embodiment according to the present disclosure.

As shown in FIG. 12, the upper surface is ground using a grinding tool 10. Grinding tool 10 moves laterally while rotating as indicated by an arrow 90. Note that grinding tool 10 is schematically shown in FIG. 12. Grinding tool 10 actually does not necessarily have such a shape or size. Also, grinding tool 10 does not necessarily move in the manner as shown in FIG. 12. When grinding ends, the upper surface of first component 31 is exposed as first exposed surface 31*e*, as shown in FIG. 13. First exposed surface 31*e* is located flush with the upper surface of first sealing resin 61. Note that first component 31 is not limited to a semiconductor die. First component 31 preferably has a structure that is less likely to be influenced in its function even when a part of the component body is ground and removed. As a component having such a structure, for example, first component 31 may be any one of a surface acoustic wave (SAW) filter, a bulk acoustic wave (BAW) filter, and the like. First component 31 may be an integrated circuit (IC) such as a silicon IC.

Figure 14:
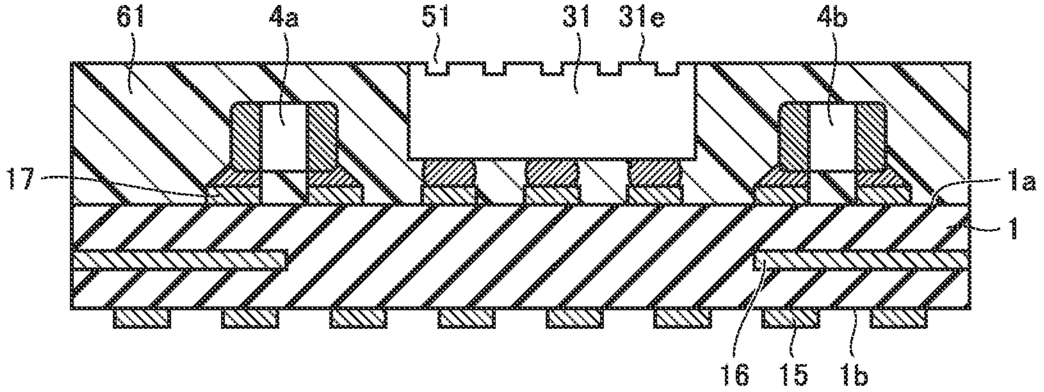
FIG. 14 is an explanatory diagram of a sixth step of the method of manufacturing the module in the first embodiment according to the present disclosure.

As shown in FIG. 14, first exposed surface 31*e* is laser-processed to form strip-shaped portion 51. In the laser processing performed at this time, it may be conceivable to employ a method of drawing strip-shaped portion 51 using a pulse laser while sequentially shifting the irradiation position. In this laser processing, a laser beam having a wavelength not transmitting through the material of first component 31 is used. Strip-shaped portion 51 may be a collection of shallow and fine recessed portions produced as laser irradiation marks.

Module 101 shown in FIG. 3 is obtained by forming shield film 81 so as to cover the upper surface and the side surface of the above-mentioned structure body in the state shown in FIG. 14.

Second Embodiment

Figure 15:
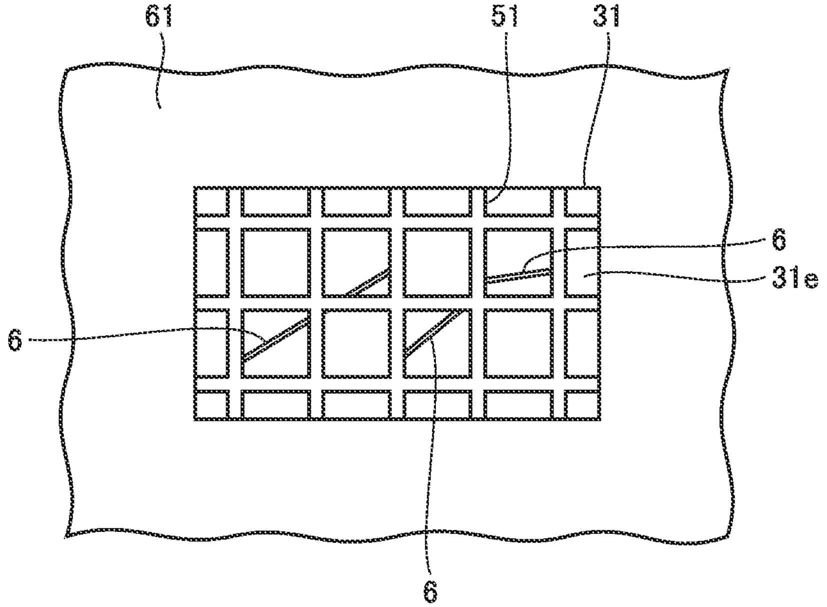
FIG. 15 is a partially enlarged plan view of a module in a second embodiment according to the present disclosure, from which a shield film is removed.

Referring to FIG. 15, a module in the second embodiment according to the present disclosure will be described. FIG. 15 shows a partial plan view of the module in the present embodiment. In the module in the present embodiment, strip-shaped portion 51 has a lattice shape and does not protrude from first exposed surface 31*e* of first component 31. Strip-shaped portion 51 is disposed so as to be accommodated only inside first exposed surface 31*e*. Since other configurations of the module in the present embodiment are the same as those described in the first embodiment, the description thereof will not be repeated.

Also in the present embodiment, the same effect as that achieved in the first embodiment can be achieved.

Third Embodiment

Figure 16:
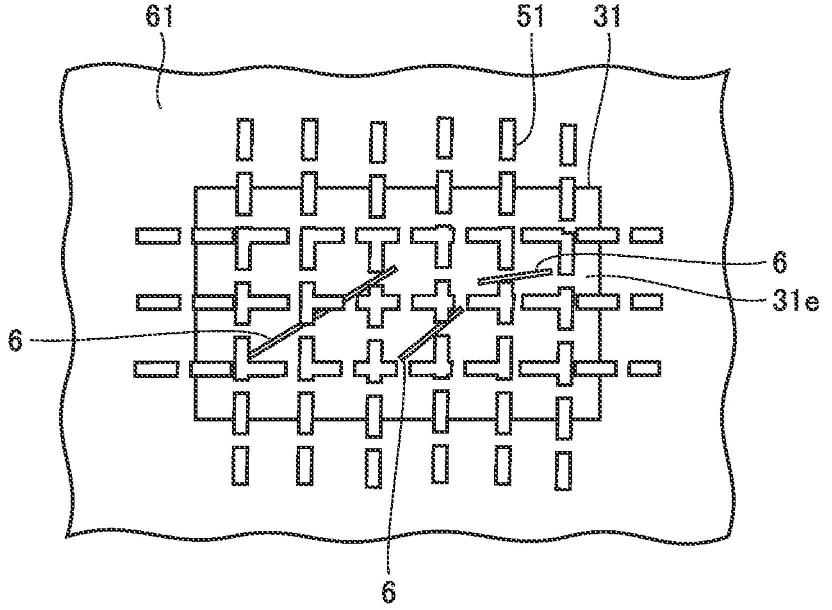
FIG. 16 is a partially enlarged plan view of a module in a third embodiment according to the present disclosure, from which a shield film is removed.

Referring to FIG. 16, a module in the third embodiment according to the present disclosure will be described. FIG. 16 shows a partial plan view of the module in the present embodiment. In the module in the present embodiment, strip-shaped portion 51 is formed in a lattice shape in a dashed line. Strip-shaped portion 51 is disposed so as to protrude from first exposed surface 31*e* of first component 31 to the surrounding area. Since other configurations of the module in the present embodiment are the same as those described in the first embodiment, the description thereof will not be repeated.

Also in the present embodiment, the same effect as that achieved in the first embodiment can be achieved.

Fourth Embodiment

Figure 17:
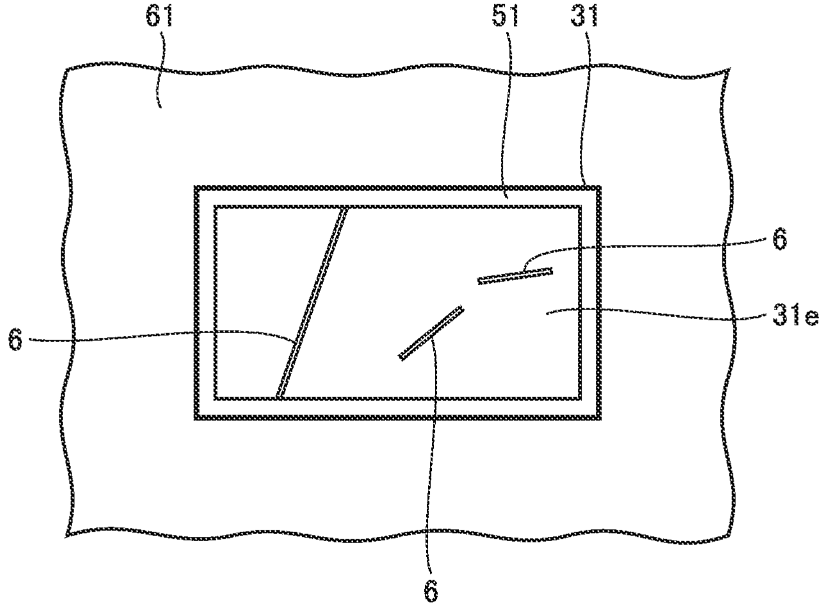
FIG. 17 is a partially enlarged plan view of a module in a fourth embodiment according to the present disclosure, from which a shield film is removed.
Figure 18:
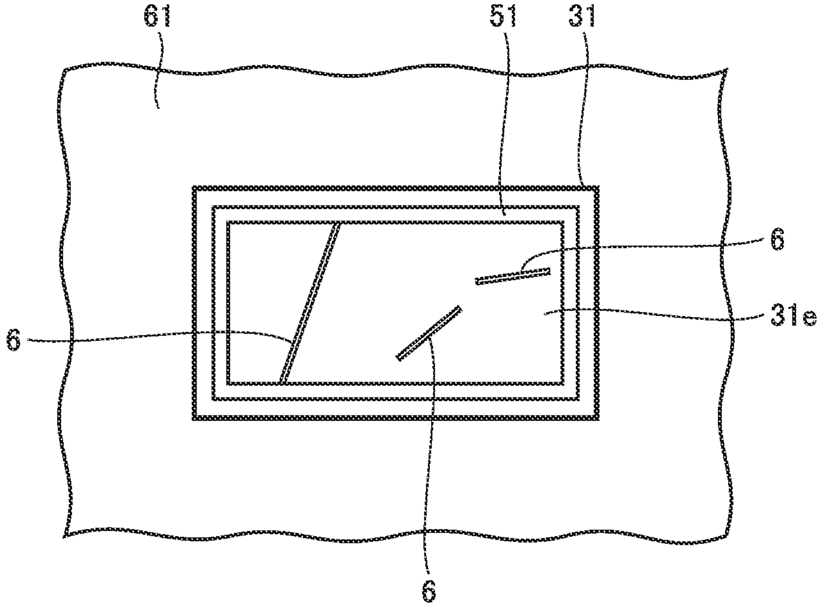
FIG. 18 is a partially enlarged plan view of a first modification of the module in the fourth embodiment according to the present disclosure, from which a shield film is removed.
Figure 19:
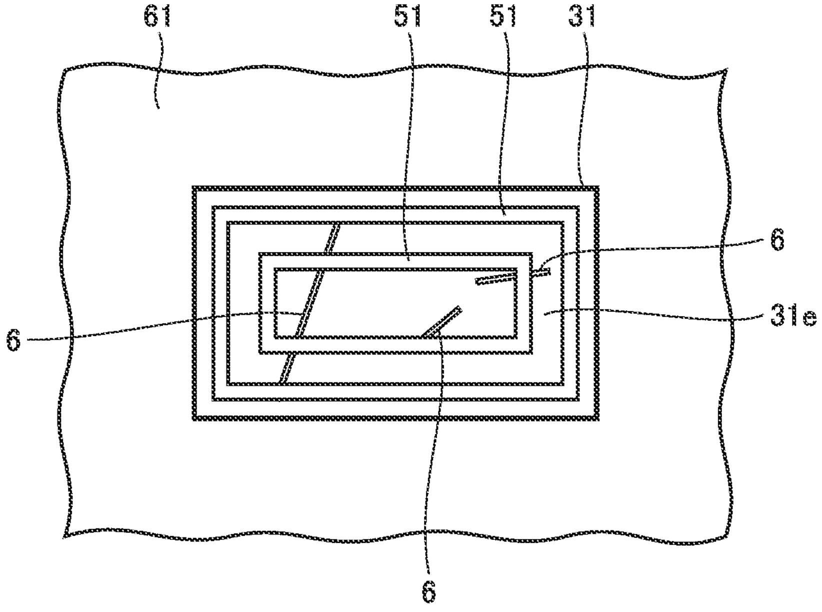
FIG. 19 is a partially enlarged plan view of a second modification of the module in the fourth embodiment according to the present disclosure, from which a shield film is removed.

Referring to FIGS. 17 to 19, a module in the fourth embodiment according to the present disclosure will be described. FIG. 17 shows a partial plan view of the module in the present embodiment. In the module in the present embodiment, strip-shaped portion 51 has a frame shape. Strip-shaped portion 51 is disposed inside the region of first exposed surface 31*e* so as to extend along the outer periphery of first exposed surface 31*e* of first component 31. Strip-shaped portion 51 is disposed along the outer edge portion of first exposed surface 31*e*. Since other configurations of the module in the present embodiment are the same as those described in the first embodiment, the description thereof will not be repeated.

Note that the shape of strip-shaped portion 51 is not limited to the shape illustrated in FIG. 17. For example, as shown in FIG. 18, strip-shaped portion 51 may be disposed to be spaced inward from the outer edge portion of first exposed surface 31*e*. As shown in FIG. 19, strip-shaped portions 51 may be arranged in multiple layers such that their frame-shaped patterns are spaced inward from each other.

As described in the present embodiment, when strip-shaped portion 51 has a frame shape, short grinding scratch 6 may not intersect strip-shaped portion 51, but grinding scratch 6 having a certain length or more intersects strip-shaped portion 51.

Also in the present embodiment, the same effect as that achieved in the first embodiment can be achieved. When first exposed surface 31*e* of first component 31 is small in size of a certain level of less, the effect of reducing the adverse effect resulting from grinding scratch 6 can be sufficiently achieved merely by arranging strip-shaped portion 51 in a frame shape as illustrated in the present embodiment.

Fifth Embodiment

Figure 20:
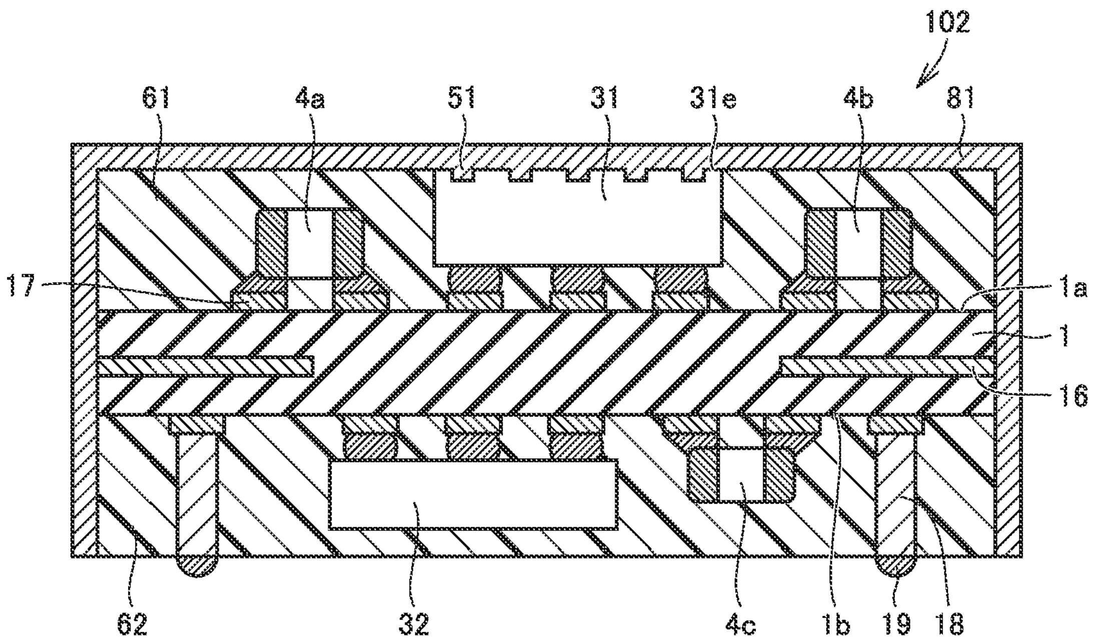
FIG. 20 is a cross-sectional view of a module in a fifth embodiment according to the present disclosure.

Referring to FIG. 20, a module in the fifth embodiment according to the present disclosure will be described. FIG. 20 shows a cross-sectional view of a module 102 in the present embodiment. The basic configuration of module 102 is the same as that of module 101 described in the first embodiment. Module 102 further includes the following configuration.

In module 102, substrate 1 has second surface 1*b* opposite to first surface 1*a*. Module 102 further includes a second component 32 mounted on second surface 1*b*, and a second sealing resin 62 that seals at least a part of second surface 1*b* and at least a side surface of second component 32. In other words, module 102 has a double-sided mounting structure.

In addition to second component 32, a component 4*c* is also mounted on second surface 1*b*. Second sealing resin 62 completely covers second component 32 and component 4*c*. A columnar electrode 18 is disposed so as to penetrate second sealing resin 62. Columnar electrode 18 connects second surface 1*b* and the lower surface of second sealing resin 62. Columnar electrode 18 has a lower end provided with an external terminal 19.

Also in the present embodiment, the effect described in the first embodiment can be achieved. Since a double-sided mounting structure is adopted in the present embodiment, a larger number of components can be mounted in a limited area of substrate 1.

Sixth Embodiment

Figure 21:
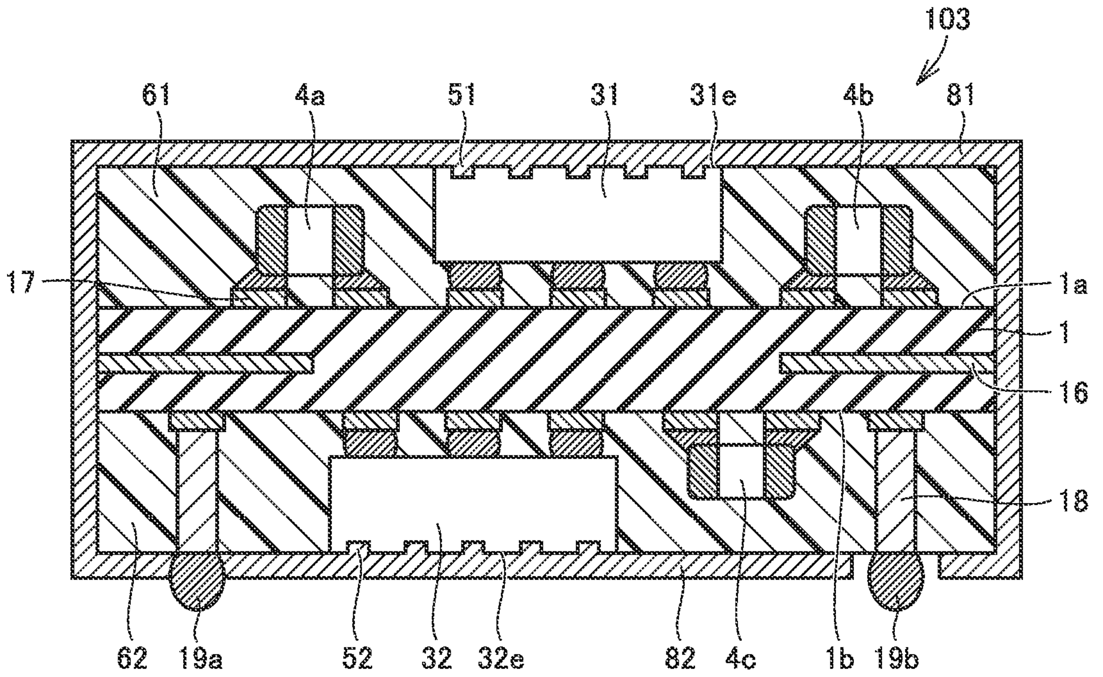
FIG. 21 is a cross-sectional view of a module in a sixth embodiment according to the present disclosure.

Referring to FIG. 21, a module in the sixth embodiment according to the present disclosure will be described. FIG. 21 shows a cross-sectional view of a module 103 in the present embodiment. The basic configuration of module 103 is the same as that of module 102 described in the fifth embodiment. Module 103 further includes the following configuration.

Module 103 includes a shield film 82. Shield film 82 is grounded and covers the surface of second sealing resin 62 on the side farther from substrate 1. The surface of second component 32 on the side farther from substrate 1 is exposed from second sealing resin 62. When the surface of second component 32 that is exposed from second sealing resin 62 is defined as a second exposed surface 32*e*, a strip-shaped portion 52 is formed also in second exposed surface 32*e*.

Shield film 82 may be contiguous to shield film 81. Module 103 includes external terminals 19*a* and 19*b* on the lower surface of second sealing resin 62. External terminals 19*a* and 19*b* are connected to the respective lower ends of columnar electrodes 18. External terminal 19*a* is a GND terminal and is in contact with shield film 82. External terminal 19*b* is a signal terminal and is separated from shield film 82. Shield film 82 is provided with an opening, and external terminal 19*b* serving as a signal terminal is disposed inside this opening so as not to come into contact with shield film 82.

When viewed from directly below, strip-shaped portion 52 has a certain pattern similarly to strip-shaped portion 51. Strip-shaped portion 52 may be formed, for example, in a lattice shape. The pattern of strip-shaped portion 52 should only be any pattern as long as it can divide a grinding scratch that may exist on second exposed surface 32*e* into pieces each having a certain length or less.

Also in the present embodiment, the effect described in the first embodiment can be achieved. In the present embodiment, not only peeling off of shield film 81 but also peeling off of shield film 82 can be prevented.

Seventh Embodiment

Figure 22:
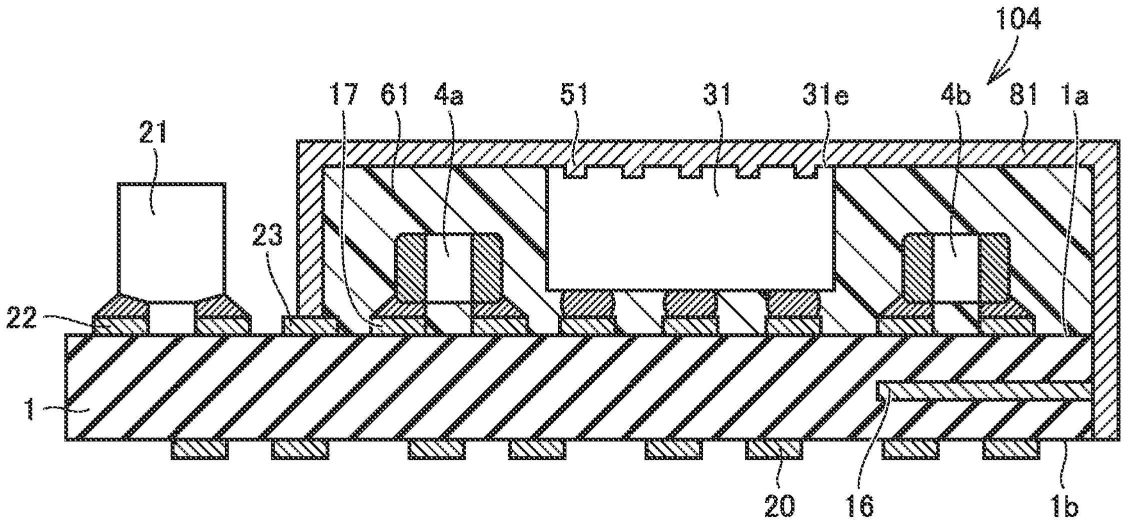
FIG. 22 is a cross-sectional view of a module in a seventh embodiment according to the present disclosure.

Referring to FIG. 22, a module in the seventh embodiment according to the present disclosure will be described. FIG. 22 shows a cross-sectional view of a module 104 in the present embodiment. The basic configuration of module 104 is the same as that of module 101 described in the first embodiment. Module 104 further includes the following configuration.

In module 104, first sealing resin 61 covers only a part of first surface 1*a* without covering the entire first surface 1*a*. In addition to electrodes 17, electrodes 22 and 23 are disposed on first surface 1*a*. A connector 21 is mounted with electrode 22 interposed therebetween. Connector 21 is not covered with first sealing resin 61. Although shield film 81 covers first sealing resin 61, connector 21 is located outside first sealing resin 61, and thus, connector 21 is not electromagnetically shielded by shield film 81. Electrode 23 is located at a boundary on first surface 1*a* between a region covered with first sealing resin 61 and a region not covered with first sealing resin 61. Electrode 23 is electrically connected to shield film 81. An antenna 20 is disposed on second surface 1*b*. Antenna 20 is formed of a conductive film. The component mounted on substrate 1 with electrode 22 interposed therebetween is not limited to connector 21 but may be other types of electronic components.

Also in the present embodiment, the effect described in the first embodiment can be achieved. In the present embodiment, communication can be established through antenna 20.

In the above-described embodiments, the strip-shaped portion is formed by laser processing, which is however merely by way of example. The strip-shaped portion is not necessarily formed by laser processing but may be formed by other methods.

Among the above-described embodiments, some of the embodiments may be employed in an appropriate combination.

Note that the above-described embodiments disclosed herein are illustrative and non-restrictive in every respect. The scope of the present disclosure is defined by the scope of the claims, and is intended to include any modifications within the meaning and scope equivalent to the scope of the claims.

1 substrate, 1*a* first surface, 1*b* second surface, 4*a*, 4*b*, 4*c* component, 6 grinding scratch, 7 crack, 8 resolidified portion, 10 grinding tool, 15 external terminal, 16 GND conductor pattern, 17, 22, 23 electrode, 18 columnar electrode, 19, 19*a*, 19*b* external terminal, 20 antenna, 21 connector, 31 first component, 31*e* first exposed surface, 32 second component, 32*e* second exposed surface, 51, 52 strip-shaped portion, 61 first sealing resin, 62 second sealing resin, 81, 82 shield film, 90 arrow, 101, 102, 103, 104 module.

The invention claimed is:

1. A module comprising:

a substrate having a first surface;

a first component mounted on the first surface;

a first sealing resin sealing at least a part of the first surface and at least a side surface of the first component; and a shield film covering a surface of the first sealing resin on a side farther from the substrate, the shield film being grounded, wherein a surface of the first component on the side farther from the substrate is exposed from the first sealing resin, when the surface of the first component exposed from the first sealing resin is defined as a first exposed surface, the first exposed surface is entirely covered by the shield film, the first exposed surface includes a first region being a strip-shaped portion and a second region being the entire first exposed surface other than the first region, and the surface roughness of the first region is lower than the surface roughness of the second region.

2. The module according to claim 1, wherein the strip-shaped portion is arranged in a lattice shape.

3. The module according to claim 2, wherein the first component has a grinding scratch and a crack below the grinding scratch, the strip-shaped portion includes a closing portion of a material of the first component, and the closing portion closes the crack.

4. The module according to claim 1, wherein the strip-shaped portion is disposed along an outer edge portion of the first exposed surface.

5. The module according to claim 4, wherein the first component has a grinding scratch and a crack below the grinding scratch, the strip-shaped portion includes a closing portion of a material of the first component, and the closing portion closes the crack.

6. The module according to claim 4, wherein the substrate has a second surface opposite to the first surface, and the module further comprises:

a second component mounted on the second surface; and a second sealing resin sealing at least a part of the second surface and at least a side surface of the second component.

7. The module according to claim 1, wherein the first component has a grinding scratch and a crack below the grinding scratch, the strip-shaped portion includes a closing portion of a material of the first component, and the closing portion closes the crack.

8. The module according to claim 7, wherein the substrate has a second surface opposite to the first surface, and the module further comprises:

a second component mounted on the second surface; and a second sealing resin sealing at least a part of the second surface and at least a side surface of the second component.

9. The module according to claim 1, wherein the region of the first exposed surface covered with the shield film includes a portion other than the strip-shaped portion, and an area of the portion other than the strip-shaped portion is larger than an area of the strip-shaped portion.

10. The module according to claim 1, wherein the first exposed surface has a grinding scratch and the strip shaped portion intersects with the grinding scratch.

11. The module according to claim 1, wherein the first exposed surface has a grinding scratch and the grinding scratch is partitioned by the strip shaped portion.

12. A module comprising:

a substrate having a first surface and a second surface opposite to the first surface;

a first component mounted on the first surface;

a first sealing resin sealing at least a part of the first surface and at least a side surface of the first component;

a shield film covering a surface of the first sealing resin on a side farther from the substrate, the shield film being grounded;

a second component mounted on the second surface; and a second sealing resin sealing at least a part of the second surface and at least a side surface of the second component, wherein a surface of the first component on the side farther from the substrate is exposed from the first sealing resin, and when the surface of the first component exposed from the first sealing resin is defined as a first exposed surface, a region of the first exposed surface covered with the shield film includes a strip-shaped portion having a locally reduced surface roughness.

13. The module according to claim 12, wherein the strip-shaped portion is arranged in a lattice shape.

* * * * *